(12) United States Patent
Foletto et al.

(10) Patent No.: US 10,690,731 B2
(45) Date of Patent: Jun. 23, 2020

(54) MAGNETIC FIELD SENSOR WITH ADAPTIVE THRESHOLD AND ASSOCIATED METHODS

(71) Applicant: Allegro MicroSystems, LLC, Manchester, NH (US)

(72) Inventors: Andrea Foletto, Annecy le Vieux (FR); Florian Kulla, Annecy (FR)

(73) Assignee: Allegro MicroSystems, LLC, Manchester, NH (US)

( * ) Notice: Subject to any disclaimer, the term of this patent is extended or adjusted under 35 U.S.C. 154(b) by 140 days.

(21) Appl. No.: 16/145,841

(22) Filed: Sep. 28, 2018

(65) Prior Publication Data
US 2020/0103474 A1    Apr. 2, 2020

(51) Int. Cl.
*G01R 33/00* (2006.01)
*G01P 3/44* (2006.01)

(52) U.S. Cl.
CPC ............ *G01R 33/0041* (2013.01); *G01P 3/44* (2013.01); *G01R 33/0029* (2013.01); *G01R 33/0035* (2013.01)

(58) Field of Classification Search
CPC .... G01R 33/0035; G01R 33/0029; G01P 3/44
See application file for complete search history.

(56) References Cited

U.S. PATENT DOCUMENTS

| | | |
|---|---|---|
| 5,442,283 A | 8/1995 | Vig et al. |
| 5,650,719 A | 7/1997 | Moody et al. |
| 5,729,130 A | 3/1998 | Moody et al. |
| 6,091,239 A | 7/2000 | Vig et al. |
| 6,525,531 B2 | 2/2003 | Forrest et al. |
| 7,362,094 B2 | 4/2008 | Voisine et al. |
| 8,058,864 B2 | 11/2011 | Scheller et al. |
| 8,089,270 B2 | 1/2012 | Scheller et al. |
| 8,598,867 B2 | 12/2013 | Foletto et al. |
| 8,723,512 B1 | 5/2014 | Burdette et al. |
| 8,736,260 B2 | 5/2014 | Foletto et al. |
| 8,957,676 B2 | 2/2015 | David et al. |
| 9,329,057 B2 | 5/2016 | Foletto et al. |
| 9,395,391 B2 | 7/2016 | Fernandez et al. |
| 9,476,899 B2 | 10/2016 | Fernandez et al. |
| 9,778,326 B2 | 10/2017 | Chen et al. |
| 9,797,961 B2 | 10/2017 | Feucht et al. |
| 9,970,996 B2 | 5/2018 | Fernandez et al. |

(Continued)

*Primary Examiner* — Alvaro E Fortich (74) *Attorney, Agent, or Firm* — Daly, Crowley, Mofford & Durkee, LLP (57) ABSTRACT

A magnetic field sensor including at least one magnetic field sensing element configured to generate a magnetic field signal indicative of a magnetic field associated with a target and a detector responsive to the magnetic field signal and to a threshold level to generate a sensor output signal containing transitions associated with features of the target in response to the magnetic field signal crossing the threshold level further includes a threshold generator to generate an adaptive threshold. The threshold generator is configured to generate the threshold level to achieve a predetermined fixed hard offset and that adapts with a variation in the airgap in order to minimize an error between times or angles of the transitions of the sensor output signal over the variation in the airgap.

23 Claims, 6 Drawing Sheets

(56) References Cited

U.S. PATENT DOCUMENTS

| | | | |
|---|---|---|---|
| 2012/0182008 A1* | 7/2012 | Ueda | G01D 5/145 |
| | | | 324/207.25 |
| 2012/0249126 A1 | 10/2012 | Friedrich et al. | |
| 2016/0123770 A1* | 5/2016 | Feucht | G01D 5/145 |
| | | | 324/207.2 |
| 2016/0123774 A1* | 5/2016 | Foletto | G01D 5/145 |
| | | | 324/207.21 |
| 2018/0259594 A1 | 9/2018 | Fernandez et al. | |

* cited by examiner

MAGNETIC FIELD SENSOR WITH ADAPTIVE THRESHOLD AND ASSOCIATED METHODS

CROSS-REFERENCE TO RELATED APPLICATIONS

Not Applicable.

STATEMENT REGARDING FEDERALLY SPONSORED RESEARCH

Not Applicable.

FIELD

This invention relates generally to magnetic field sensors and, more particularly, to magnetic field sensors implementing an adaptive threshold.

BACKGROUND

As is known, magnetic field sensors are used in a variety of applications. One example application is in motion (e.g., rotation) detectors where a magnetic field sensor is used to detect motion of an object, such as a ferromagnetic object, for example, a gear or ring magnet. In motion detectors, the magnetic field is typically detected by one or more magnetic field sensing elements, such as Hall effect elements or magnetoresistance elements, which provide a signal (i.e., a magnetic field signal) proportional to a detected magnetic field.

Some motion detectors generate an output signal indicative of the speed of motion of the object. Other motion detectors generate an output signal indicative of a direction of motion of the object as well. One such motion detector is described in U.S. Pat. No. 8,624,588 entitled "Apparatus and Method for Providing an Output Signal Indicative of a Speed of Rotation and a Direction of Rotation as a Ferromagnetic Object," which is assigned to the assignee of the present disclosure and incorporated herein by reference in its entirety.

Motion detectors are widely used in automobile control systems, for example to detect motion of a target object (e.g., camshaft) and to provide information (e.g., an absolute angle of rotation of the target object) to an engine control processor for ignition timing control, fuel management and other operations. With this information, the engine control processor can adjust the timing of firing of the ignition system, the timing of fuel injection by the fuel injection system and perform other operations.

In high precision applications such as automobiles, accuracy variations in the detected motion of a target object (e.g., resulting from irregularities in a sensed target profile of the target object) can be problematic. Engine ignition timing, for example, depends on consistent detection accuracy. Some magnetic field sensor integrated circuits (ICs) contain circuitry and methods to mitigate the effects of irregularities resulting from mechanical variations such as rotational wobble or changes in an airgap between the IC and the target object.

SUMMARY

According to the disclosure, a magnetic field sensor includes at least one magnetic field sensing element configured to generate a magnetic field signal indicative of a magnetic field associated with a target having features and spaced from the at least one magnetic field sensing element by an airgap and a detector responsive to the magnetic field signal and to a threshold level to generate a sensor output signal containing transitions, each transition associated with a feature of the target and occurring in response to the magnetic field signal crossing the threshold level, wherein a difference between angles of the transitions and locations of the associated features of the target is called hard offset. A threshold generator is configured to generate the threshold level to achieve a predetermined fixed hard offset and that adapts to variations in the airgap in order to minimize an error between angles of the transitions of the sensor output signal over the variation in the airgap.

With this arrangement, error between transitions of the sensor output signal and mechanical features of the target can be accurately controlled and minimized over airgap variations for a selected hard offset. This advantage is achieved by generating adaptive threshold levels that change as a function of airgap and/or magnetic field signal amplitude in order to thereby minimize error over airgap for a selected hard offset.

Features may include one or more of the following individually or in combination with other features. The threshold generator may be configured to generate the threshold level according to a mathematical function that characterizes a relationship between the threshold level and the airgap. The mathematical function may compute the threshold level based on a peak-to-peak level of the magnetic field signal or any signal/information that depends on the airgap. The threshold is thus a percentage of the peak-to-peak level of the magnetic field signal, which percentage changes based on the airgap. The mathematical function may be derived based at least in part on one or more parameters of the target and the at least one magnetic field sensing element. The mathematical function may be derived by mapping the hard offset at a plurality of different airgaps. The mathematical function may be further derived by curve fitting, such as with a linear curve fitting. The threshold generator may be configured to generate the threshold level during a calibration mode of operation of the sensor. The threshold generator may be configured to generate the threshold level periodically during a running mode of operation of the sensor. The predetermined fixed hard offset may be a first predetermined fixed hard offset on rising edges of the magnetic field signal and a second predetermined fixed hard offset different than the first predetermined fixed hard offset on falling edges of the magnetic field signal. The predetermined fixed hard offset may be a first predetermined fixed hard offset when a state machine is in a first state and a second predetermined fixed hard offset different than the first predetermined fixed hard offset when the state machine is in a second state different than the first state.

Also described is a method including generating a magnetic field signal with one or more magnetic field sensing elements, the magnetic field signal indicative of a magnetic field associated with a target having features and spaced from the one or more magnetic field sensing elements by an airgap, generating a threshold level that achieves a predetermined fixed hard offset comprising a difference between angles of transitions of a sensor output signal and locations of associated features of the target and that adapts with a variation in the airgap in order to minimize an error between angles of the transitions of the sensor output signal over the variation in the airgap, and generating the sensor output signal comprising transitions, each transition associated with a feature of the target and occurring in response to the magnetic field signal crossing the threshold level.

Features may include one or more of the following individually or in combination with other features. Generating the threshold level may include using a mathematical function that characterizes a relationship between the threshold level and the airgap. Using the mathematical function to compute the threshold level may include using a peak-to-peak level of the magnetic field signal in the mathematical function. Generating the threshold level further may include deriving the mathematical function based at least in part on one or more parameters of the target and the one or more magnetic field sensing elements. Deriving the mathematical function comprises mapping the hard offset at a plurality of different airgaps. In embodiments, deriving the mathematical function may include curve fitting, such as a linear curve fitting. Generating the threshold level may include generating the threshold level during a calibration mode of operation and/or generating the threshold level periodically during a running mode of operation.

According to a further aspect, a magnetic field sensor includes at least one magnetic field sensing element configured to generate a magnetic field signal indicative of a magnetic field associated with a target having features and spaced from the at least one magnetic field sensing element by an airgap, a detector responsive to the magnetic field signal and to a threshold level to generate a sensor output signal containing transitions, each transition associated with a feature of the target and occurring in response to the magnetic field signal crossing the threshold level, wherein a difference between angles of the transitions and locations of the associated features of the target comprises a hard offset, and means for generating the threshold level that achieves a predetermined fixed hard offset and that adapts with a variation in the airgap in order to minimize an error between angles of the transitions of the sensor output signal over the variation in the airgap.

Features may include one or more of the following individually or in combination with other features. The threshold level generating means may be configured to generate the threshold level according to a mathematical function that characterizes a relationship between the threshold level and the airgap, wherein the threshold level is computed based on a peak-to-peak level of the magnetic field signal. The mathematical function may be derived based at least in part on one or more parameters of the target and the at least one magnetic field sensing element.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Before describing the present invention, some introductory concepts and terminology are explained. As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate or in the plane of the substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of maximum sensitivity perpendicular to a substrate, while metal based or metallic magnetoresistance elements (e.g., GMR, TMR, AMR) and vertical Hall elements tend to have axes of maximum sensitivity parallel to a substrate.

As used herein, the term "magnetic field signal" is used to describe any signal that results from a magnetic field experienced by a magnetic field sensing element.

As used herein, the term "magnetic field sensor" or simply "sensor" is used to describe a circuit that uses one or more magnetic field sensing elements, generally in combination with other circuits. The magnetic field sensor can be, for example, a rotation detector, a movement detector, a current sensor, or a proximity detector. A rotation detector can sense rotation of an object, for example, advance and retreat of magnetic domains of a ring magnet or advance and retreat of gear teeth of a ferromagnetic gear. The term "movement detector" can be used to describe either a rotation detector or a magnetic field sensor that can sense different movement, e.g., linear movement, of a ferromagnetic object, for example, linear movement of magnetic domains of a ring magnet or linear movement of gear teeth of a ferromagnetic gear.

Magnetic field sensors are used in a variety of applications, including, but not limited to an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor is used in combination with a back-bias or other magnet, and a magnetic field sensor that senses a magnetic field density of a magnetic field. The circuits and techniques described herein apply to any magnetic field sensor capable of detecting a magnetic field.

As used herein, the terms "processor" and "controller" are used to describe electronic circuitry that performs a function, an operation, or a sequence of operations. The function, operation, or sequence of operations can be hard coded into the electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory and/or in a discrete electronic circuit, which can be analog or digital. A processor or controller can contain internal processors or modules that perform portions of the function, operation, or sequence of operations. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

It should be understood that a so-called "comparator" can be comprised of an analog comparator having a two-state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Figure 1:
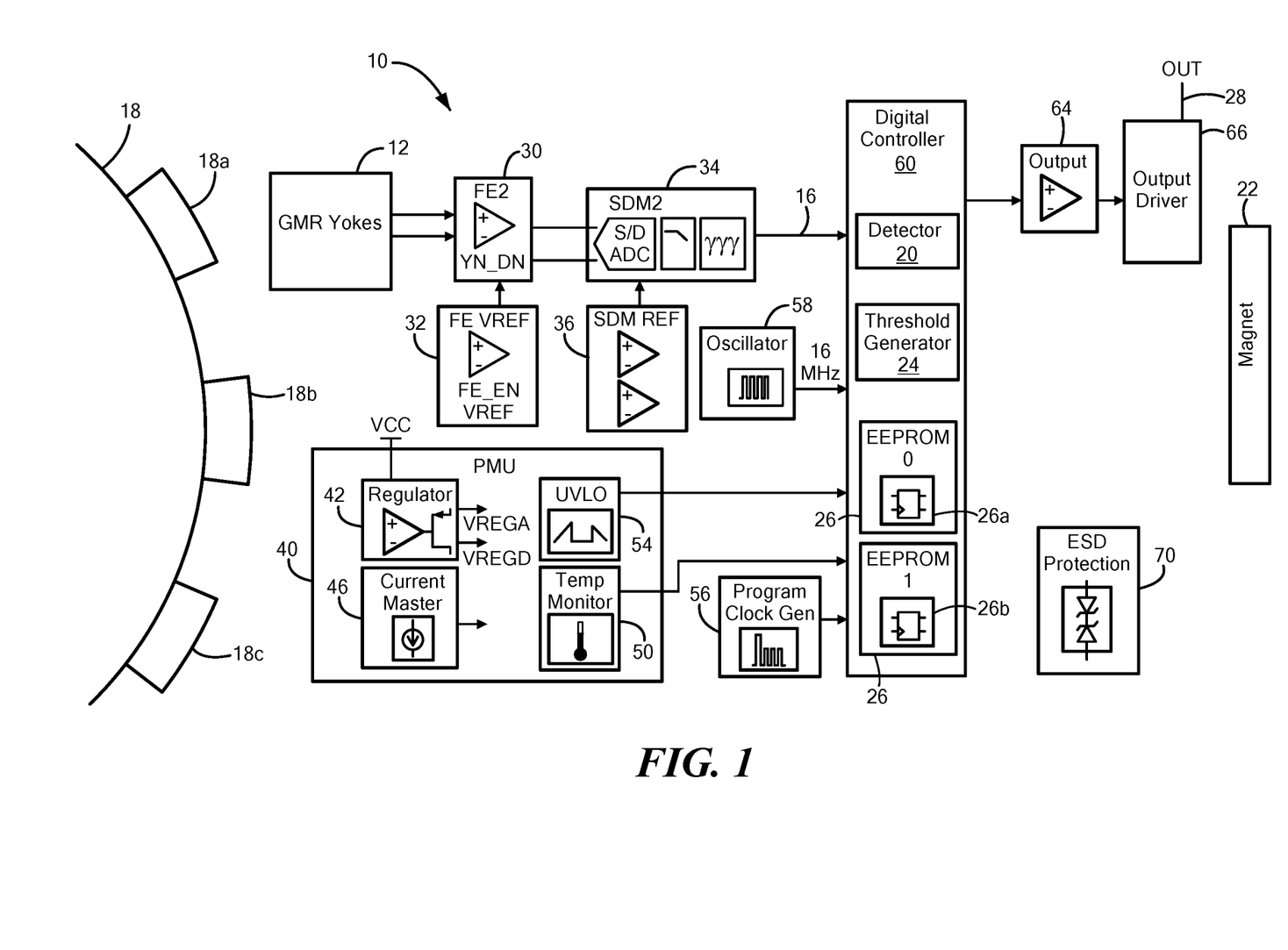
FIG. 1 is a block diagram of a magnetic field sensor including a threshold generator according to the disclosure.

Referring to FIG. 1, a magnetic field sensor 10 includes at least one magnetic field sensing element 12 configured to generate a magnetic field signal 16 indicative of a magnetic field associated with a target 18 and a detector 20 responsive to the magnetic field signal and to a threshold level from a threshold generator 24 to generate a sensor output signal 28 containing transitions associated with features of the target in response to the magnetic field signal crossing the threshold level. As will be explained, the threshold generator 24 is configured to generate an adaptive threshold level in order to achieve a predetermined fixed hard offset and that adapts with variations in airgap in order to minimize an error between angles of the transitions of the sensor output signal over the variation in the airgap.

Target 18 can have a variety of forms, including, but not limited to a gear having gear teeth 18a-18c or a ring magnet having one or more pole pair. Also, linear arrangements of ferromagnetic objects that move linearly are possible. In the example embedment of FIG. 1, magnetic field sensor 10 may take the form of a rotation detector to detect passing gear teeth, for example, gear teeth 18a-18c of a ferromagnetic gear or, more generally target object 18. A permanent magnet 22 can be placed at a variety of positions proximate to the gear 18, resulting in fluctuations of a magnetic field proximate to the gear as the gear rotates in a so-called "back-bias" arrangement.

Features of the target 18 are spaced from the sensing elements 12 by an airgap. Although intended to be fixed once the sensor 10 is in place in a particular application, airgap can vary for a variety of reasons. A difference between angles of the transitions of the sensor output signal 28 and locations of the associated features 18a-18c of the target 28 is referred to as a "hard offset."

Sensing elements 12 can take a variety of forms, such as the illustrated GMR yokes as may be arranged in one or more bridge or other configurations in order to generate one or more single-ended or differential signals indicative of the sensed magnetic field. A front-end amplifier 30 can be used to process the magnetic field sensing element output signal to generate a further signal for coupling to an analog-to-digital converter (ADC) 34 as may include one or more filters, such as a low pass filter and/or notch filter, and as may take the form of a sigma delta modulator to generate a digital magnetic field signal 16. Features of the magnetic field signal processing can include a front-end reference 32 and a sigma delta reference 36.

Sensor 10 includes a power management unit (PMU) 40 as may contain various circuitry to perform power management functions. For example, a regulator 42 can output a regulated voltage for powering analog circuitry of the sensor (VREGA) and/or a regulated voltage for powering digital circuitry of the sensor (VREGD). A bias current source 46, a temperature monitor 50 and an undervoltage lockout 54 can monitor current, temperature, and voltage levels and provide associated status signals to a digital controller 60. A clock generation element 56 and an oscillator 58 are coupled to the digital controller 60.

Digital controller 60 processes the magnetic field signal 16 to determine the speed, position, and/or direction of movement, such as rotation of target 18 and outputs one or more digital signals to an output protocol module 64. More particularly, controller 60 determines the speed, position, and/or direction of target 18 based on the magnetic field signal 16 and can combine this information with fault information in some embodiments to generate the sensor output signal 28 in various formats. The output of module 64 is fed to an output driver 66 that provides the sensor output signal 28 in various formats, such as a so-called two-wire format in which the output signal is provided in the form of current pulses on the power connection to the sensor or a three-wire format in which the output signal is provided at a separate dedicated output connection. Formats of the output signal 28 can include variety of formats, for example a pulse-width modulated (PWM) signal format, a Single Edge Nibble Transmission (SENT) format, a Serial Peripheral Interface (SPI) format, a Local Interconnect Network (LIN) format, a CAN (Controller Area Network) format, an Inter-Integrated Circuit (I²C) format, or other similar signal formats. Sensor 10 can further include electrostatic discharge (ESD) protection 70.

The digital controller includes detector 20, threshold generator 24, and memory 26 such as EEPROMs 26a, 26b. As described further below, the threshold generator 24 is configured to generate an adaptive threshold level according to a mathematical function that characterizes a relationship between the threshold level and the airgap. As will be explained, the mathematical function can be based on a peak-to-peak level of the magnetic field signal generated by sensing elements 12 (or as processed by amplifier 30). The mathematical function may be derived based at least in part on one or more parameters of the target and the at least one magnetic field sensing element. The mathematical function may be derived by mapping the hard offset at a plurality of different airgaps. The mathematical function may be further derived by curve fitting, such as with a linear curve fitting. Memory 26 can be used to store values for various sensor functionality including storing function coefficients for use by the threshold generator 24 in generating the adaptive threshold levels for use by detector 20 as will be explained.

Detector 20 is coupled to receive the threshold level thus generated and the magnetic field signal 16 and compare the received levels to generate a binary, two-state, detector output signal that has transitions when the signal 16 crosses the threshold level. Movement speed of the target 18 can be detected in accordance with the frequency of the binary signal.

It should be appreciated that a direction of rotation of the target 28 may be determined in embodiments containing multiple sensing elements 12 configured to generate phase separated magnetic field signals (as are sometimes referred to as channel signals), in which case the direction of rotation can be determined based on a relative phase or relative time difference (e.g., lag or lead) of a particular edge transition of detector output signals associated with the phase separated magnetic field signals.

Figure 2:
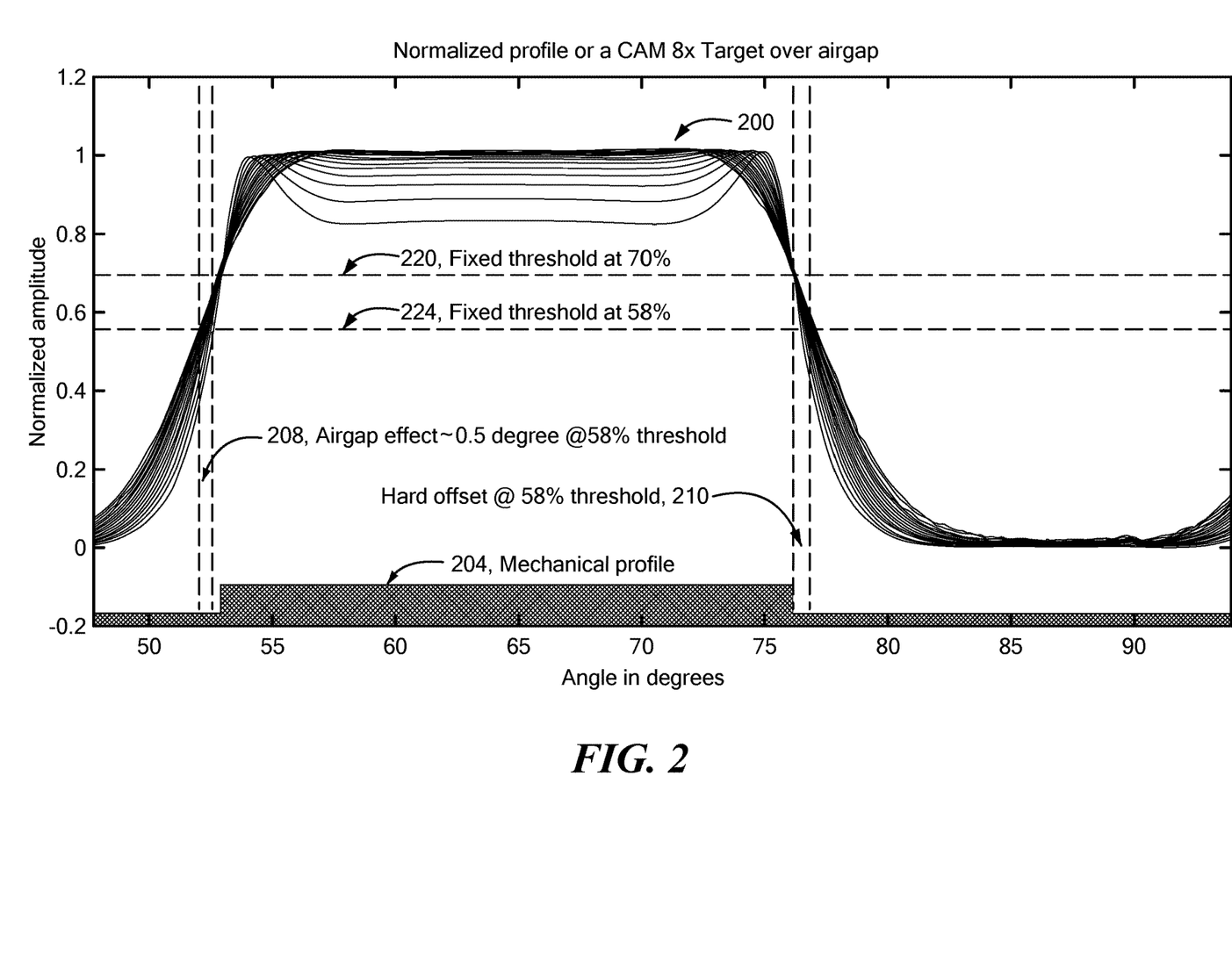
FIG. 2 shows a magnetic field signal generated by the magnetic field sensor of FIG. 1 in relation to a mechanical profile of a proximate target for a plurality of different airgaps.

Referring to FIG. 2, magnetic field signals 200, as may be generated by the magnetic field sensor 10 of FIG. 1 and thus, which may be the same as or similar to the signal at output by the sensing elements 12 or amplifier 30, are shown in relation to the mechanical profile 204 of a proximate target for various airgaps. The horizontal axis represents angle in units of degrees and the vertical axis represents normalized units of signal amplitude. It will be appreciated that angle can alternatively be represented by time herein. Each of magnetic field signals 200 is associated with a different airgap, which airgap variation may range from 1.5 mm to 4.5 mm in some embodiments. The variation of the magnetic field signals 200 in degrees over such an airgap variation range can be on the order of 0.5 degrees in the example embodiment (as shown at label 208 and labeled "airgap effect").

Consideration of magnetic field signals 200 reveals that the signals converge at a signal amplitude of approximately 0.7. Thus, if the threshold level were set at a fixed level of approximately seventy percent of the peak-to-peak magnetic field signal level as labelled 220 in FIG. 2 (i.e., a fixed level of 0.7 in FIG. 2), then transitions of the resulting detector output signal would coincide with the mechanical profile 204 resulting in a hard offset of approximately zero. Stated differently, to minimize the airgap effect, the threshold level would be positioned at approximately 70% (i.e., at the point at which all of the curves cross each other).

In some applications, a non-zero hard offset is desired. Consider for example an application in which a hard offset on the order of 0.6 degrees (as shown at label 210) is desired. In this example, a fixed threshold level on the order of approximately fifty-eight percent of the peak-to-peak magnetic field signal as labelled 224 in FIG. 2 (i.e., a fixed level of 0.58 in FIG. 2) would achieve the desired hard offset. However, if the threshold level were at a fixed level 0.58 as necessary to achieve the desired hard offset 210, then a significant error over airgap variations would result.

Figure 3:
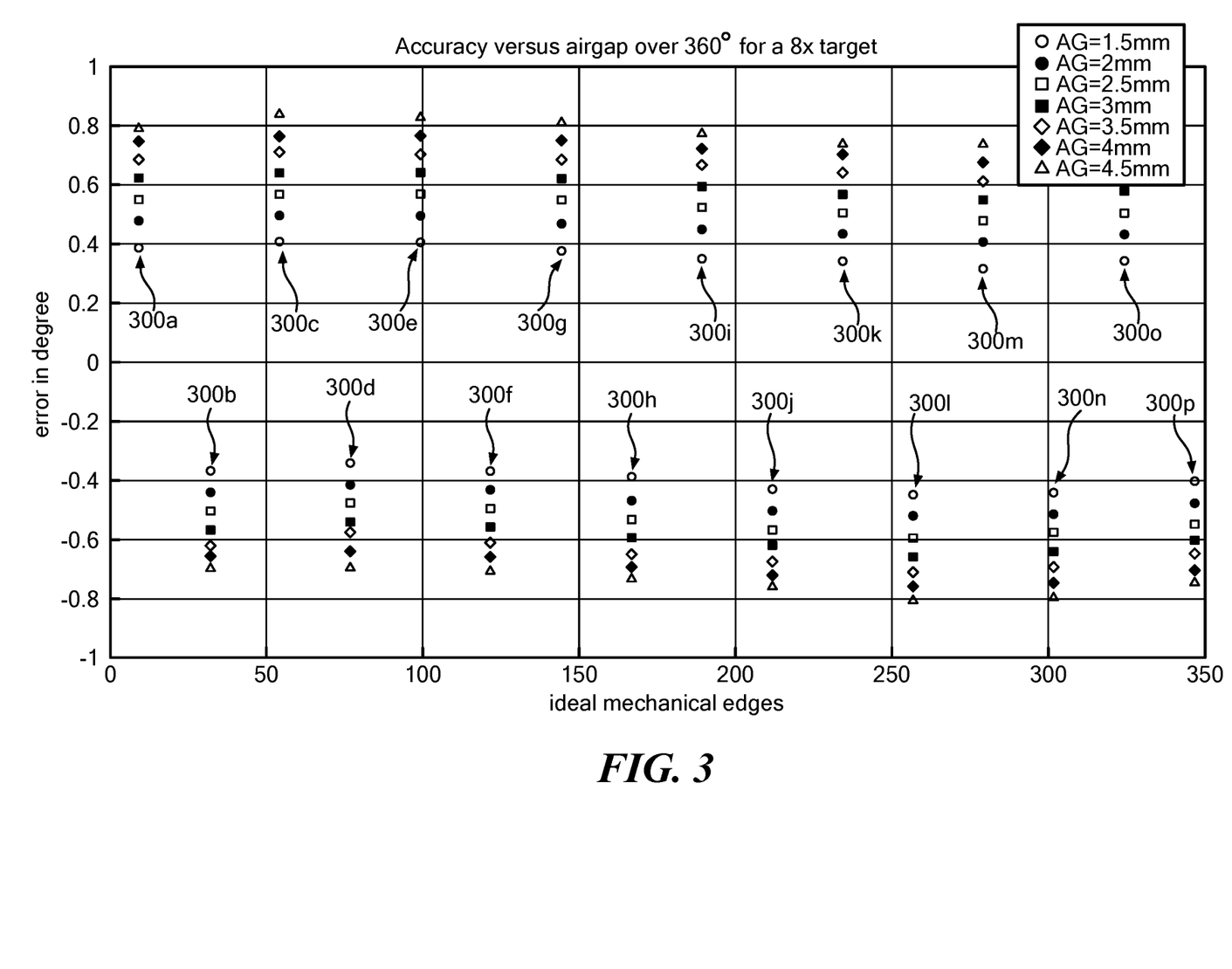
FIG. 3 is a graph illustrating detection accuracy versus target feature position for a plurality of different airgaps using a fixed threshold level.

FIG. 3 is a graph illustrating example detection accuracy (i.e., the extent to which transitions of the detector output signal, or sensor output signal varies from the mechanical profile of the target) versus target feature position for a plurality of different airgaps using a fixed threshold level of fifty-eight percent. The horizontal axis represents ideal mechanical edges in units of degrees and the vertical axis represents error between the detector output signal transition angles and the mechanical profile of the target over airgap variations also in units of degrees. The illustrated example is associated with detection of rotation of a target having eight features (i.e., gear teeth) and thus, resulting in sixteen detector output signal transitions as represented by indicator sets 300a-300p as shown, with each set of indicators including an indicator corresponding to each of a plurality of different airgaps as shown in the legend of FIG. 3.

Consideration of FIG. 3 reveals that the accuracy over airgap is not negligible and varies by approximately +/−0.2 degrees. For example, if the desired hard offset is 0.6, then the optimal threshold corresponds to an airgap between 2.5 mm and 3.0 mm; whereas, for a different desired hard offset, the optimal threshold corresponds a different airgap. Stated differently, for each airgap, there exists an optimal threshold level as a function of the desired hard offset that minimizes the error over airgap. In order to achieve a desired hard offset with minimal error over airgap, the threshold level can be adapted as a function of the airgap according to the disclosure.

Figure 4:
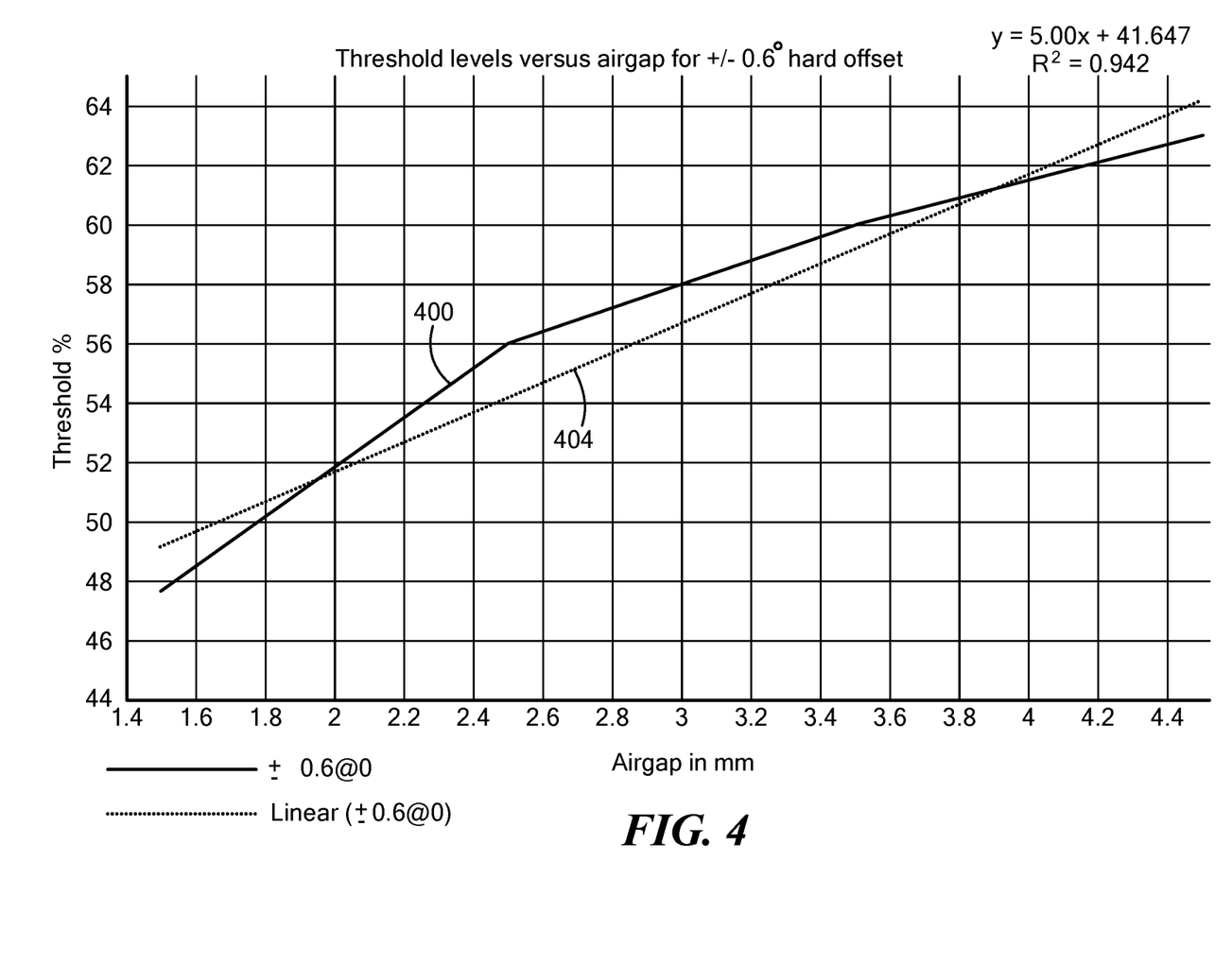
FIG. 4 is a graph illustrating ideal threshold levels versus airgap to achieve a predetermined hard offset and threshold levels based on a curve fitting.

Referring also to FIG. 4, a graph includes a waveform 400 illustrating ideal threshold levels as a percentage of the peak-to-peak magnetic field signal amplitude versus airgap in order to achieve a predetermined hard offset of 0.6 for an example target. The horizontal axis represents airgap units of millimeters and the vertical axis represents the threshold level in percentages of the peak-to-peak magnetic field signal.

The ideal threshold levels of waveform 400 can be determined by calculations, or mapping the hard offset at a plurality of different airgaps based on the particular target and sensor details and configuration. For example, this information can be derived empirically during manufacture and is a function of the sensor based at least in part on one or more parameters of the magnetic field sensing element(s) of the sensor (e.g., sensing element type) and of the target (e.g., tooth/valley shape, pair pole magnetization, target diameter).

Ideally the threshold generator 24 generates threshold value according to the waveform 400 and provides such threshold levels to the detector 20 for use in generating the detector output signal. However, as a practical matter, it may be too computationally intensive to replicate the precise optimal threshold levels represented by curve 400 in use.

Accordingly, an approximation of the ideal threshold levels 400 as represented by waveform 404 can be used.

Threshold levels representing waveform 404 can be generated by the threshold generator 24 using a mathematical function that characterizes a relationship between the threshold level and the airgap. In the example shown, waveform 404 can be represented by the following mathematical function:

$$\text{Threshold level} = 5 * \text{Airgap} + 41.65 \quad (1)$$

The mathematical function of equation (1) can be derived in various manners to approximate the ideal waveform 400. In the example embodiment, linear curve fitting is used whereby the line represented by equation (1) represents a linear best fit of the ideal threshold levels of waveform 400. More particularly, the y-intercept of 41.65 and slope of 5 of equation (1) can be stored in EEPROM 26 and received by the threshold generator 24 for computation of the adaptive threshold level according to the detected airgap.

The controller 60 can detect the airgap for use by the threshold generator 24 in generating the threshold level in various ways. For example, airgap can be determined based on the peak-to-peak amplitude of the magnetic field signal, based on a single peak level of the magnetic field signal, based on an average of a plurality of peaks of the magnetic field signals, to name a few examples.

In an example embodiment in which airgap is determined based on the peak-to-peak amplitude of the magnetic field signal, equation (1) can be given by:

$$\text{Threshold} = \alpha * pk\text{-}pk + C^{te} \quad (2)$$

where $\alpha$ represents the slope which can be programmable depending on the target/application, pk-pk represents the peak-to-peak amplitude of the magnetic field signal (such as the digital version 16 of the processed magnetic field signal in FIG. 1) as captured by controller 60, and $C^{te}$ is a constant which can be programmable depending on the target/application.

A user may be provided with values comprising waveform 400 and options can be provided for allowing the user to decide on the approximation 404 to be used. In other words, providing the slope $\alpha$ and constant $C^{te}$ as programmable parameters can permit the user to determine the precise curve to be used to approximate the ideal threshold levels 404 for their particular application and desired hard offset.

The threshold generator 24 can calculate the adaptive threshold levels during sensor calibration (e.g., when the sensor has seen at least a first entire rotation of the target) or dynamically during operation (e.g., at each period, such as at each tooth and/or valley) of the target rotation.

It will be appreciated that the threshold generator 24 can be configured to achieve different hard offsets on the rising edge and on the falling edge of the magnetic field signal. The threshold generator 24 can also be configured to provide different hard offsets based on a state of an internal state machine (e.g., a first hard offset can be provided during a calibration mode and a second, different hard offset can be provided during a running mode).

Figure 5:
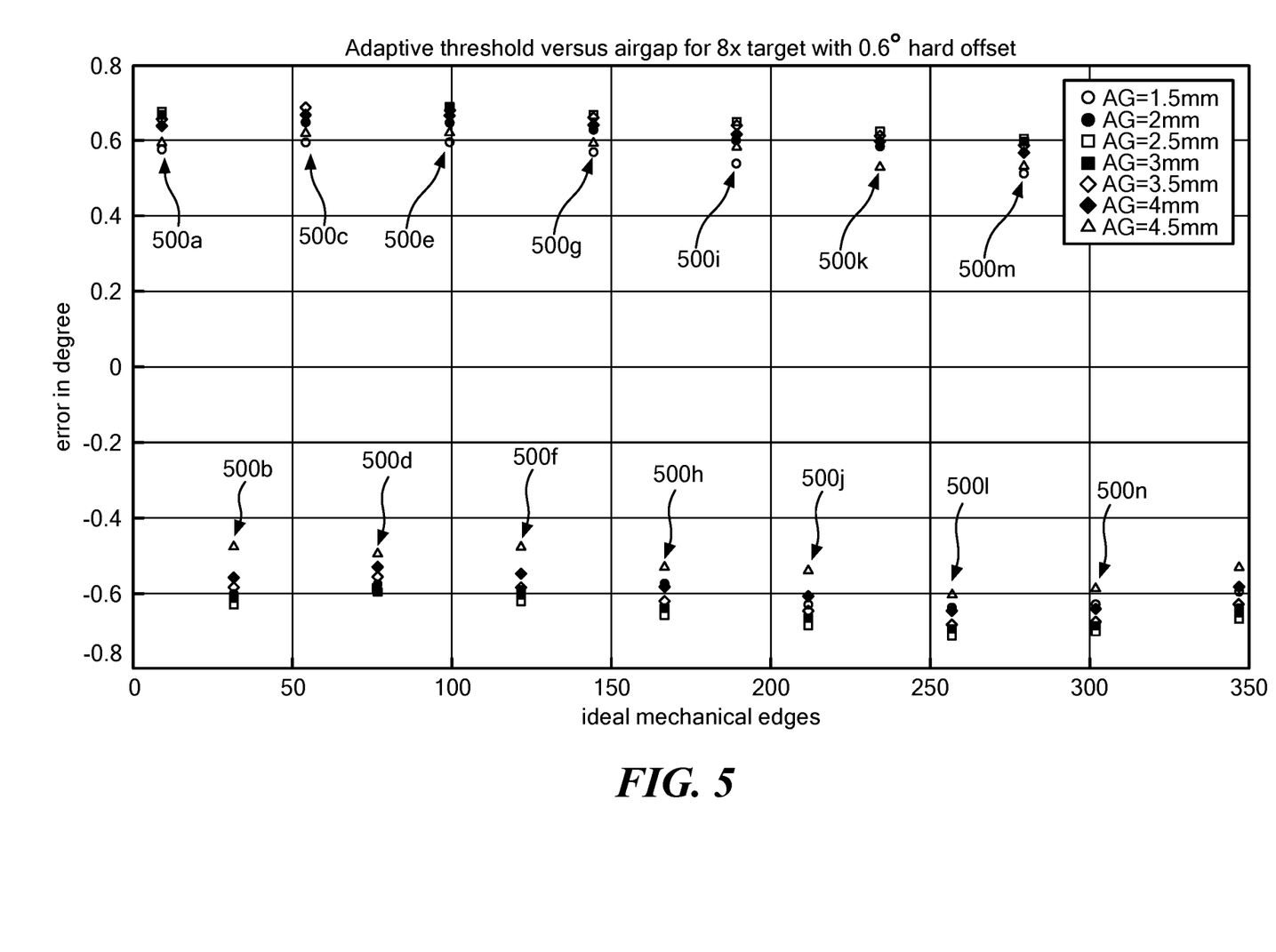
FIG. 5 is a graph illustrating detection accuracy versus target feature position for a plurality of different airgaps using the adaptive threshold level according to the disclosure.

FIG. 5 is a graph illustrating detection accuracy versus target feature position for a plurality of different airgaps using the adaptive threshold level 404 with the horizontal axis representing ideal mechanical edges in units of degrees and the vertical axis representing error between the detector output signal transition angles and the mechanical profile of the target over airgap variations also in units of degrees. The illustrated example is associated with the same eight feature target as FIG. 3 and thus, indicator sets 500a-500p correspond to indicator sets 300a-300p of FIG. 3.

Consideration of FIG. 5 illustrates the accuracy improvement achieved with use of an adaptive threshold 404 whereby the resulting accuracy over airgap is on the order of approximately +/−0.1 degrees, representing a 50% improvement as compared to use of a fixed threshold level as illustrated by FIG. 3.

Figure 6:
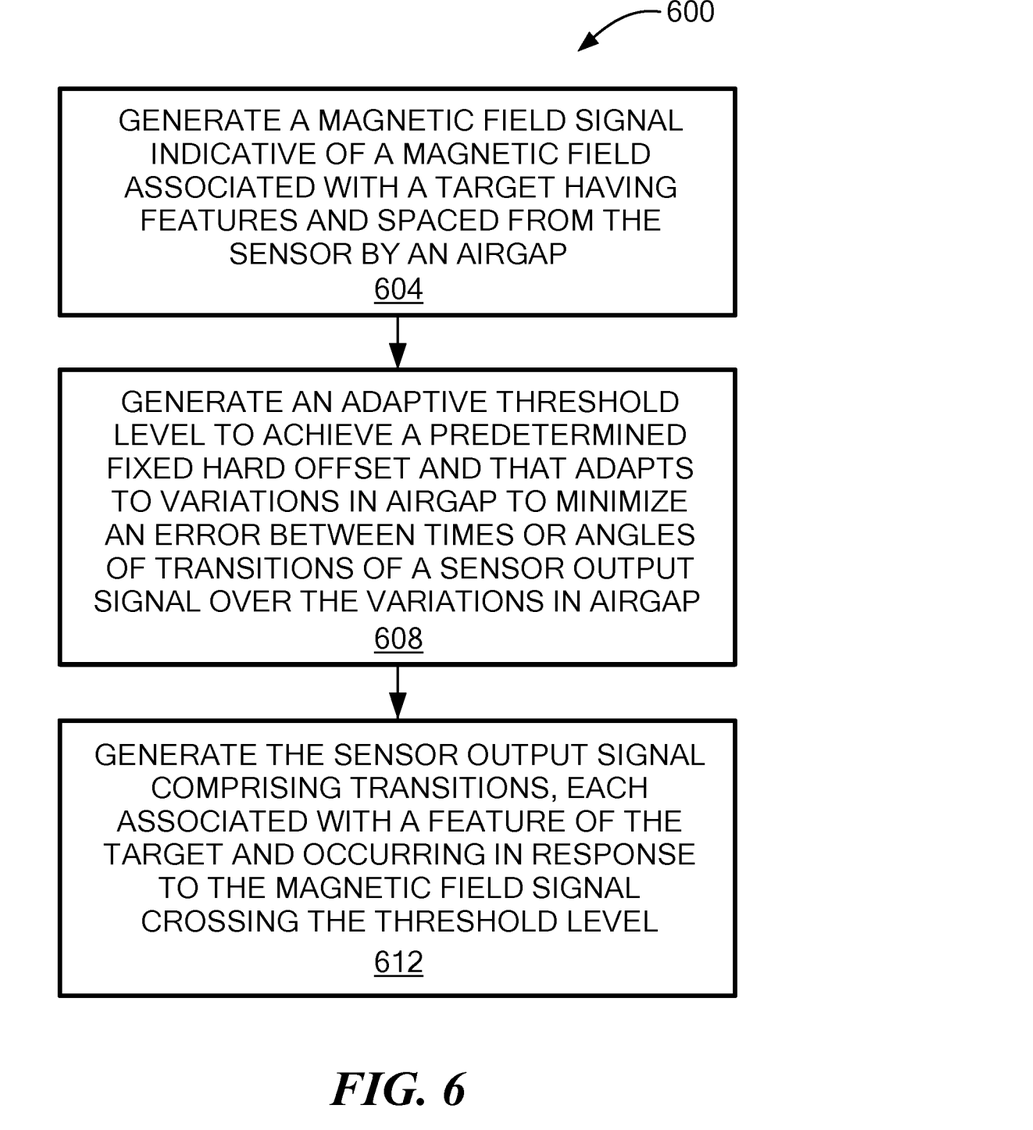
FIG. 6 is a flow diagram illustrating a process for generating the sensor output signal with the adaptive threshold level according to the disclosure.

Referring to FIG. 6, a method 600 for generating a sensor output signal using an adaptive threshold level according to the disclosure begins at block 604 in which a magnetic field signal, such as signal 16 in FIG. 1, is generated. The magnetic field signal is indicative of a magnetic field associated with a target having features spaced from the sensor by an airgap.

At block 608, an adaptive threshold level, such as approximation level 404 of FIG. 4, is generated in order to achieve a predetermined fixed hard offset. The adaptive threshold level thus generated adapts with a variation in airgap in order to minimize the error between angles of the transitions of the sensor output signal over the variation in airgap.

At block 612, the sensor output signal, such as output signal 28 of FIG. 1, is generated by comparing the magnetic field signal to the threshold level, as may be implemented by detector 20 of FIG. 1. The sensor output signal includes transitions, each associated with a feature of the target and occurring in response to the magnetic field signal crossing the threshold level.

All references cited herein are hereby incorporated herein by reference in their entirety.

Having described preferred embodiments, it will now become apparent to one of ordinary skill in the art that other embodiments incorporating their concepts may be used. Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

It is felt therefore that these embodiments should not be limited to disclosed embodiments, but rather should be limited only by the spirit and scope of the appended claims.

What is claimed is:

1. A magnetic field sensor comprising:
   at least one magnetic field sensing element configured to generate a magnetic field signal indicative of a magnetic field associated with a target having features and spaced from the at least one magnetic field sensing element by an airgap;
   a detector responsive to the magnetic field signal and to a threshold level to generate a sensor output signal containing transitions, each transition associated with a feature of the target and occurring in response to the magnetic field signal crossing the threshold level, wherein a difference between angles of the transitions and locations of the associated features of the target comprises a hard offset; and
   a threshold generator, implemented in a microprocessor, configured to generate the threshold level that achieves a predetermined fixed hard offset and that adapts with a variation in the airgap in order to minimize an error between angles of the transitions of the sensor output signal over the variation in the airgap.

2. The magnetic field sensor of claim 1 wherein the threshold generator is configured to generate the threshold level according to a mathematical function that characterizes a relationship between the threshold level and the airgap.

3. The magnetic field sensor of claim 2 wherein the mathematical function is used to compute the threshold level based on a peak-to-peak level of the magnetic field signal.

4. The magnetic field sensor of claim 2 wherein the mathematical function is derived based at least in part on one or more parameters of the target and the at least one magnetic field sensing element.

5. The magnetic field sensor of claim 4 wherein the mathematical function is derived by mapping the hard offset at a plurality of different airgaps.

6. The magnetic field sensor of claim 5 wherein the mathematical function is further derived by curve fitting.

7. The magnetic field sensor of claim 6 wherein the curve fitting is a linear curve fitting.

8. The magnetic field sensor of claim 1 wherein the threshold generator is configured to generate the threshold level during a calibration mode of operation of the sensor.

9. The magnetic field sensor of claim 1 wherein the threshold generator is configured to generate the threshold level periodically during a running mode of operation of the sensor.

10. The magnetic field sensor of claim 1 wherein the predetermined fixed hard offset comprises a first predetermined fixed hard offset on rising edges of the magnetic field signal and a second predetermined fixed hard offset different than the first predetermined fixed hard offset on falling edges of the magnetic field signal.

11. The magnetic field sensor of claim 1 wherein the predetermined fixed hard offset comprises a first predetermined fixed hard offset when a state machine is in a first state and a second predetermined fixed hard offset different than the first predetermined fixed hard offset when the state machine is in a second state different than the first state.

12. A method comprising:
generating a magnetic field signal with one or more magnetic field sensing elements, the magnetic field signal indicative of a magnetic field associated with a target having features and spaced from the one or more magnetic field sensing elements by an airgap;
generating a threshold level that achieves a predetermined fixed hard offset comprising a difference between angles of transitions of a sensor output signal and locations of associated features of the target and that adapts with a variation in the airgap in order to minimize an error between angles of the transitions of the sensor output signal over the variation in the airgap; and
generating the sensor output signal comprising transitions, each transition associated with a feature of the target and occurring in response to the magnetic field signal crossing the threshold level.

13. The method of claim 12 wherein generating the threshold level comprises using a mathematical function that characterizes a relationship between the threshold level and the airgap.

14. The method of claim 13 wherein using the mathematical function to compute the threshold level comprises using a peak-to-peak level of the magnetic field signal in the mathematical function.

15. The method of claim 13 wherein generating the threshold level further comprises deriving the mathematical function based at least in part on one or more parameters of the target and the one or more magnetic field sensing elements.

16. The method of claim 15 wherein deriving the mathematical function comprises mapping the hard offset at a plurality of different airgaps.

17. The method of claim 16 wherein deriving the mathematical function further comprises curve fitting.

18. The method of claim 17 wherein the curve fitting comprises a linear curve fitting.

19. The method of claim 12 wherein generating the threshold level comprises generating the threshold level during a calibration mode of operation.

20. The method of claim 12 wherein generating the threshold level comprises generating the threshold level periodically during a running mode of operation.

21. A magnetic field sensor comprising:
at least one magnetic field sensing element configured to generate a magnetic field signal indicative of a magnetic field associated with a target having features and spaced from the at least one magnetic field sensing element by an airgap;
a detector responsive to the magnetic field signal and to a threshold level to generate a sensor output signal containing transitions, each transition associated with a feature of the target and occurring in response to the magnetic field signal crossing the threshold level, wherein a difference between angles of the transitions and locations of the associated features of the target comprises a hard offset; and
means for generating the threshold level that achieves a predetermined fixed hard offset and that adapts with a variation in the airgap in order to minimize an error between angles of the transitions of the sensor output signal over the variation in the airgap.

22. The magnetic field sensor of claim 21 wherein the threshold level generating means is configured to generate the threshold level according to a mathematical function that characterizes a relationship between the threshold level and the airgap, wherein the threshold level is computed based on a peak-to-peak level of the magnetic field signal.

23. The magnetic field sensor of claim 22 wherein the mathematical function is derived based at least in part on one or more parameters of the target and the at least one magnetic field sensing element.

* * * * *

UNITED STATES PATENT AND TRADEMARK OFFICE
CERTIFICATE OF CORRECTION

PATENT NO. : 10,690,731 B2
APPLICATION NO. : 16/145841
DATED : June 23, 2020
INVENTOR(S) : Andrea Foletto et al.

Page 1 of 1

It is certified that error appears in the above-identified patent and that said Letters Patent is hereby corrected as shown below:

In the Specification

Column 4, Line 31 delete "element (AMR)" and replace with --(AMR) element--.

Column 6, Line 14 delete "pair" and replace with --pairs--.

Column 7, Line 3 delete "include variety" and replace with --include a variety--.

Column 8, Line 37 delete "corresponds a" and replace with --corresponds to a--.

Column 9, Line 35 delete "16" and replace with --16--.

Signed and Sealed this
Ninth Day of November, 2021

Drew Hirshfeld
*Performing the Functions and Duties of the*
*Under Secretary of Commerce for Intellectual Property and*
*Director of the United States Patent and Trademark Office*